US009653609B2

(12) United States Patent
Yoo et al.

(10) Patent No.: US 9,653,609 B2
(45) Date of Patent: May 16, 2017

(54) THIN FILM TRANSISTOR AND ORGANIC LIGHT EMITTING DIODE DISPLAY INCLUDING THE SAME

(71) Applicant: SAMSUNG DISPLAY CO., LTD., Yongin, Gyeonggi-Do (KR)

(72) Inventors: Hee jun Yoo, Yongin-si (KR); Sang Ho Park, Suwon-si (KR); Joung-Keun Park, Asan-si (KR); Ki Wan Ahn, Seoul (KR); Joo Sun Yoon, Seoul (KR); Seung Min Lee, Jeju-si (KR); Yong Jae Jang, Seoul (KR); Jae Hyuk Jang, Seongnam-si (KR); Kwang Young Choi, Incheon (KR); Jung Hyun Kim, Seoul (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 0 days.

(21) Appl. No.: 14/718,336

(22) Filed: May 21, 2015

(65) Prior Publication Data
US 2016/0155858 A1    Jun. 2, 2016

(30) Foreign Application Priority Data

Nov. 28, 2014    (KR) ........................ 10-2014-0169122

(51) Int. Cl.
*H01L 29/786*    (2006.01)
*H01L 29/417*    (2006.01)
*H01L 27/07*    (2006.01)

(52) U.S. Cl.
CPC .... *H01L 29/78648* (2013.01); *H01L 27/0705* (2013.01); *H01L 29/41733* (2013.01); *H01L 29/78672* (2013.01); *H01L 29/78696* (2013.01)

(58) Field of Classification Search
CPC ......... H01L 29/78648; H01L 29/78678; H01L 29/78696; H01L 27/3248
See application file for complete search history.

(56) References Cited

U.S. PATENT DOCUMENTS 6,462,723 B1 * 10/2002 Yamazaki ............ H04N 9/3173
257/365
6,916,716 B1 * 7/2005 Goad ................ H01L 21/26586
257/E21.618

(Continued)

FOREIGN PATENT DOCUMENTS

KR        10-0770470 B1    10/2007
KR    10-2007-0107677 A    11/2007

(Continued)

*Primary Examiner* — John P Dulka
*Assistant Examiner* — Christina Sylvia
(74) *Attorney, Agent, or Firm* — Lee & Morse P.C.

(57) ABSTRACT

A thin film transistor including a substrate; a first gate electrode on the substrate; a first insulating layer covering the substrate and the first gate electrode; a semiconductor on the first insulating layer and overlapping the first gate electrode; a second insulating layer covering the first insulating layer and the semiconductor; a second gate electrode on the second insulating layer and crossing the first gate electrode in plane; a third insulating layer covering the second gate electrode and the second insulating layer; a first source electrode and a first drain electrode on the third insulating layer and connected to the semiconductor; and a second source electrode and a second drain electrode on a same layer as the first source electrode and the first drain electrode and connected to the semiconductor.

13 Claims, 5 Drawing Sheets

(56) References Cited

U.S. PATENT DOCUMENTS

| | | | |
|---|---|---|---|
| 2004/0056257 A1* | 3/2004 | Sakamoto | G09G 3/3233 257/79 |
| 2011/0079784 A1* | 4/2011 | Im | H01L 27/3262 257/59 |
| 2011/0309351 A1 | 12/2011 | Kumaki et al. | |
| 2014/0353605 A1* | 12/2014 | Kim | H01L 27/124 257/40 |

FOREIGN PATENT DOCUMENTS

| KR | 10-2007-0118541 A | 12/2007 |
|---|---|---|
| KR | 10-2009-0089940 A | 8/2009 |
| KR | 10-2011-0069908 A | 6/2011 |
| KR | 10-1108176 B1 | 1/2012 |

* cited by examiner

FIG. 5

THIN FILM TRANSISTOR AND ORGANIC LIGHT EMITTING DIODE DISPLAY INCLUDING THE SAME

CROSS-REFERENCE TO RELATED APPLICATION

Korean Patent Application No. 10-2014-0169122, filed on Nov. 28, 2014, in the Korean Intellectual Property Office, and entitled: "Thin Film Transistor and Organic Light Emitting Diode Display Including the Same," is incorporated by reference herein in its entirety.

BACKGROUND

1. Field

The present disclosure relates to a thin film transistor and an organic light emitting diode display including the same.

2. Description of the Related Art

An organic light emitting diode display may include two electrodes and an organic emission layer positioned therebetween, and may emit light when an electron injected from a cathode, which may be one electrode, and a hole injected from an anode, which may be the other electrode, are coupled with each other in the organic emission layer to form an exciton and the exciton discharges energy.

SUMMARY

Embodiments may be realized by providing a thin film transistor, including a substrate; a first gate electrode on the substrate; a first insulating layer covering the substrate and the first gate electrode; a semiconductor on the first insulating layer and overlapping the first gate electrode; a second insulating layer covering the first insulating layer and the semiconductor; a second gate electrode on the second insulating layer and crossing the first gate electrode in plane; a third insulating layer covering the second gate electrode and the second insulating layer; a first source electrode and a first drain electrode on the third insulating layer and connected to the semiconductor; and a second source electrode and a second drain electrode on a same layer as the first source electrode and the first drain electrode and connected to the semiconductor.

The first source electrode and the first drain electrode may be positioned in a length direction of the first gate electrode, and the second source electrode and the second drain electrode may be positioned in a length direction of the second gate electrode.

The first source electrode and the first drain electrode may face each other based on the second gate electrode, and the second source electrode and the second drain electrode may face each other based on the first gate electrode.

The semiconductor may include a first channel region overlapping the second gate electrode, and a first source region and a first drain region positioned at respective sides of the first channel region, and a second channel region overlapping the first gate electrode, and a second source region and a second drain region positioned at respective sides of the second channel region, and the first channel region and the second channel region may correspond to a same region.

The first source electrode and the first drain electrode may be connected to the first source region and the first drain region through a pair of first contact holes which are formed in the second insulating layer and the third insulating layer to expose the first source region and the first drain region, respectively, and the second source electrode and the second drain electrode may be connected to the second source region and the second drain region through a pair of second contact holes which are formed in the second insulating layer and the third insulating layer to expose the second source region and the second drain region, respectively.

The first source electrode, the second source electrode, the first drain electrode, and the second drain electrode may surround the first channel region in plane.

The thin film transistor may further include a first gate line transferring a first gate signal to the first gate electrode; and a second gate line transferring a second gate signal to the second gate electrode. The first gate electrode may be a part of the first gate line, the second gate electrode may be a part of the second gate line, and the first gate line and the second gate line may be electrically separated from each other.

Embodiments may be realized by providing an organic light emitting diode display, including a substrate; a thin film transistor on the substrate; and an organic light emitting diode connected to the thin film transistor, the thin film transistor including a first gate electrode on the substrate, a first insulating layer covering the substrate and the first gate electrode, a semiconductor on the first insulating layer and overlapping the first gate electrode, a second insulating layer covering the first insulating layer and the semiconductor, a second gate electrode on the second insulating layer and crossing the first gate electrode in plane, a third insulating layer covering the second gate electrode and the second insulating layer, a first source electrode and a first drain electrode on the third insulating layer and connected to the semiconductor, and a second source electrode and a second drain electrode on a same layer as the first source electrode and the first drain electrode and connected to the semiconductor.

The first source electrode and the first drain electrode may be positioned in a length direction of the first gate electrode, and the second source electrode and the second drain electrode may be positioned in a length direction of the second gate electrode.

The first source electrode and the first drain electrode may face each other based on the second gate electrode, and the second source electrode and the second drain electrode may face each other based on the first gate electrode.

The semiconductor may include a first channel region overlapping the second gate electrode, and a first source region and a first drain region positioned at respective sides of the first channel region, and a second channel region overlapping the first gate electrode, and a second source region and a second drain region positioned at respective sides of the second channel region, and the first channel region and the second channel region may correspond to a same region.

The first source electrode, the second source electrode, the first drain electrode, and the second drain electrode may surround the first channel region in plane.

BRIEF DESCRIPTION OF THE DRAWINGS

Features will become apparent to those of skill in the art by describing in detail exemplary embodiments with reference to the attached drawings in which.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawings, the thickness of layers, films, panels, regions, etc., may be exaggerated for clarity. In the drawings, for understanding and ease of description, the thickness of some layers and areas is exaggerated. It will be understood that when an element such as a layer, film, region, or substrate is referred to as being "on" another element, it can be directly on the other element or intervening elements may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Then, a thin film transistor according to an exemplary embodiment will be described in detail with reference to FIGS. 1 to 4.

Figure 1:
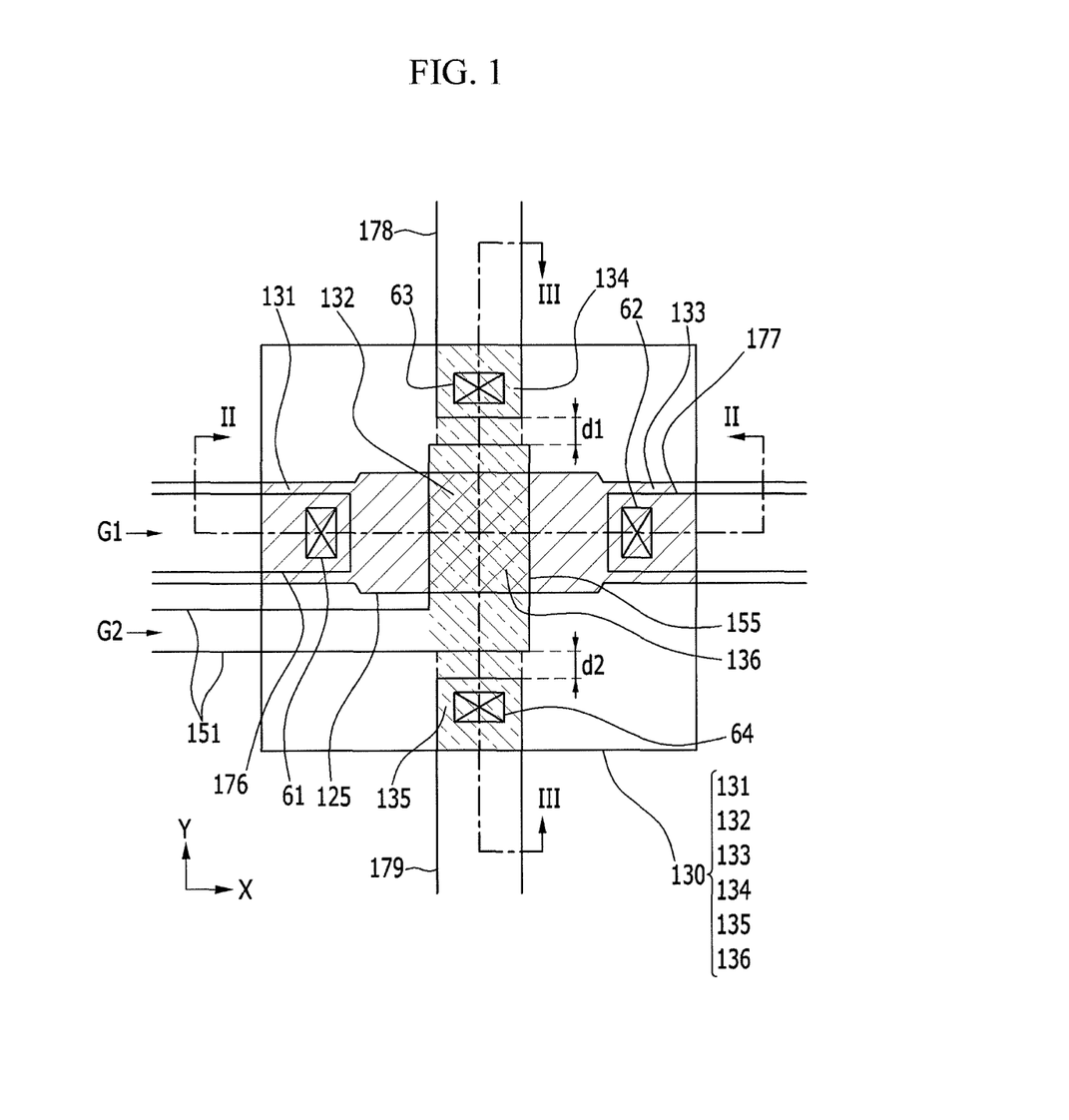
FIG. 1 illustrates a layout view of a thin film transistor according to an exemplary embodiment.
Figure 2:
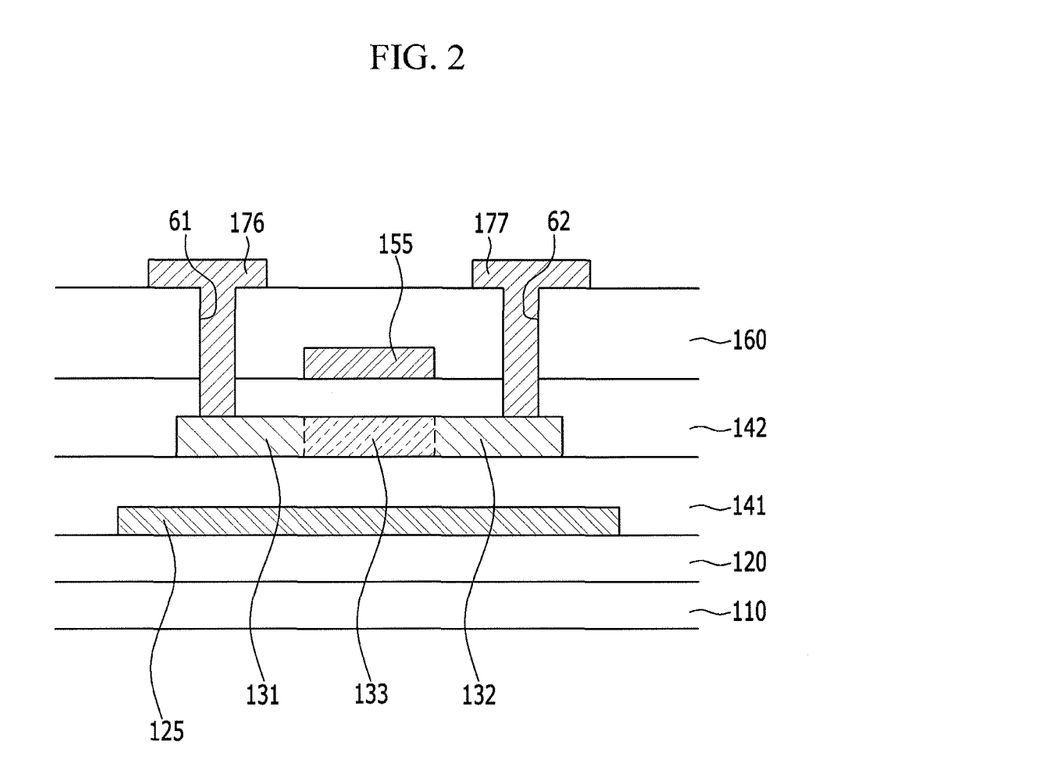
FIG. 2 illustrates a cross-sectional view taken along line II-II of FIG. 1.
Figure 3:
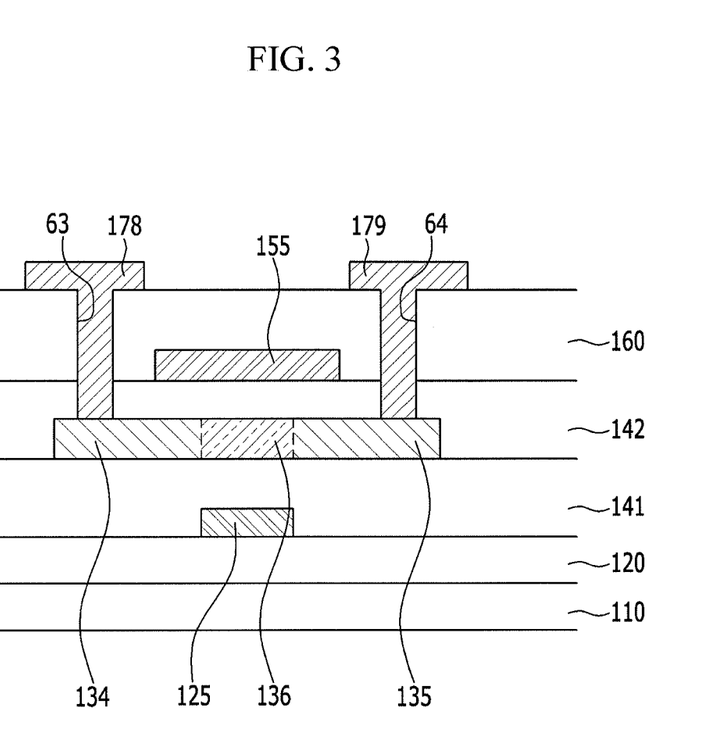
FIG. 3 illustrates a cross-sectional view taken along line of FIG. 1.
Figure 4:
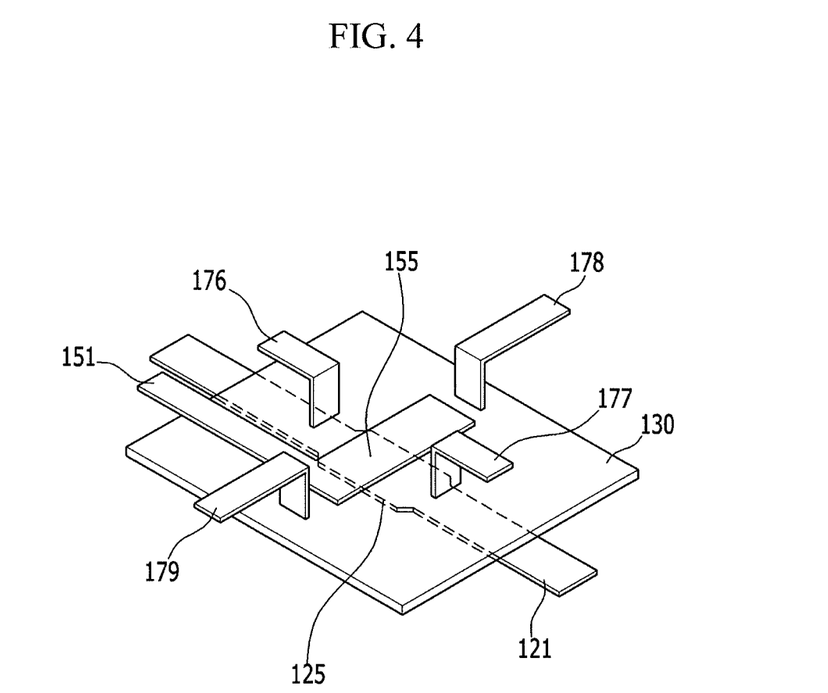
FIG. 4 illustrates a perspective view of a main part of the thin film transistor according to an exemplary embodiment.

FIG. 1 illustrates a layout view of a thin film transistor according to an exemplary embodiment, FIG. 2 illustrates a cross-sectional view taken along line II-II of FIG. 1, FIG. 3 illustrates a cross-sectional view taken along line of FIG. 1, and FIG. 4 illustrates a perspective view of a main part of the thin film transistor according to an exemplary embodiment.

As illustrated in FIGS. 1 to 4, in a thin film transistor according to an exemplary embodiment, a buffer layer 120 may be formed on a substrate 110 made of, for example, transparent glass or plastic. The buffer layer 120 may serve to help improve a characteristic of polysilicon by blocking impurities from the substrate 110 during a crystallization process for forming polysilicon and reduce stress which may be applied to the substrate 110.

A first gate electrode 125 may be formed on the buffer layer 120. The first gate electrode 125 may correspond to an expanded portion of a first gate line 121 transferring a first gate signal G1 and extending in a horizontal direction, e.g., the x direction. In an exemplary embodiment, the gate line 121 may extend in the horizontal direction, e.g., the x direction.

On the first gate electrode 125 and the buffer layer 120, a first insulating layer 141 covering the first gate electrode 125 and the buffer layer 120 may be formed and may cover the first gate electrode 125 to insulate the first gate electrode 125 and the buffer layer 120 from each other. The first insulating layer 141 may be made of silicon nitride ($SiN_x$) or silicon oxide ($SiO_x$).

A semiconductor 130 may be formed on the first insulating layer 141. The semiconductor 130 may overlap with the first gate electrode 125 and may have a larger area than the first gate electrode 125.

The semiconductor 130 may include a first channel region 133 overlapping with the first gate electrode 155, and a first source region 131 and a first drain region 132 positioned at both sides of the first channel region 133, respectively, e.g., positioned at respective sides of the first channel region 133. The semiconductor 130 may include a second channel region 136 overlapping with the first gate electrode 125, and a second source region 134 and a second drain region 135 positioned at both sides of the second channel region 136, respectively. The first channel region 133 and the second channel region 136 may correspond to the same region.

The semiconductor 130 may be made of polysilicon, and the first channel region 133 (in an embodiment, the second channel region 136) may be channel-doped with an N-type impurity or a P-type impurity, and the first source region 131, the first drain region 132, the second source region 134, and the second drain region 135 may be source/drain-doped at a higher doping concentration than the first channel region 133.

On the semiconductor 130 and the first insulating layer 141, a second insulating layer 142 made of silicon nitride ($SiN_x$) or silicon oxide (SiOx) may be formed.

A second gate electrode 155 may be formed on the second insulating layer 142. The second gate electrode 155 may cross the first gate electrode 125 in plane, e.g., in plan view, e.g., the second gate electrode 155 may overlap the first gate electrode 125 in a cross-sectional view. The second gate electrode 155 may be an end extended in a vertical direction, e.g., the y direction, extended from a second gate line 151, which may transfer a second gate signal G2 and may extend in a horizontal direction, e.g., the x direction. The first gate line 121 and the second gate line 151 may be electrically separated from each other, and different signals may be applied to the first gate line 121 and the second gate line 151.

On the second gate electrode 155 and the second insulating layer 142, a third insulating layer 160 made of silicon nitride ($SiN_x$) or silicon oxide ($SiO_x$) may be formed and may cover the second gate electrode 155 to insulate the second gate electrode 155 and the second insulating layer 142 from each other.

On the third insulating layer 160, a first source electrode 176 and a first drain electrode 177 may be formed, and the first source electrode 176 and the first drain electrode 177 may be positioned in a length direction x of the first gate electrode 125. The first source electrode 176 and the first drain electrode 177 may face each other based on the second gate electrode 155, e.g., the first source electrode 176 and the first drain electrode 177 may be positioned on opposite sides of the second gate electrode. The first source electrode 176 and the first drain electrode 177 may overlap with the first gate line 121.

On the third insulating layer 160, a second source electrode 178 and a second drain electrode 179 may be formed, and the second source electrode 178 and the second drain electrode 179 may be positioned in a length direction y of the second gate electrode 155. The second source electrode 178 and the second drain electrode 179 may face each other based on the first gate electrode 125. The second source electrode 178 and the second drain electrode 179 may be spaced apart from the second gate electrode 155 at predetermined intervals d1 and d2 in plane, e.g., in plan view, e.g., the second source electrode 178 and the second drain electrode 179 may be spaced apart from the second gate electrode 155 at predetermined intervals d1 and d2 in the y direction.

The first source electrode 176 and the drain electrode 177 may be connected with, e.g., to, the first source region 131 and the first drain region 132 through a pair of first contact holes 61 and 62 which may be formed in the second insulating layer 142 and the third insulating layer 160 to expose the first source region 131 and the first drain region 132, respectively. The second source electrode 178 and the second drain electrode 179 may be connected with the second source region 134 and the second drain region 135 through a pair of first contact holes 63 and 64 which may be formed in the second insulating layer 142 and the third insulating layer 143 to expose the second source region 134 and the second drain region 135, respectively.

The first source electrode 176, the first source region 131, the first channel region 133, the first drain region 132, and the first drain electrode 177 which may be positioned in the length direction x of the semiconductor 130, may be used as a current path, and the second source electrode 178, the second source region 134, the second channel region 136, the first drain region 135, and the first drain electrode 177 which may be positioned in the width direction y of the semiconductor 130, may also be used as the current path.

The first gate electrode 125, the first channel region 133, the first source electrode 176, and the first drain electrode 177 may form a first thin film transistor, and the second gate electrode 155, the second channel region, the second source electrode 178, and the second drain electrode 179 may form a second thin film transistor. The first channel region 133 and the second channel region 136 may correspond to the same region, and the first source electrode 176, the second source electrode 178, the first drain electrode 177, and the second drain electrode 179 may surround the first channel region 133 (in an embodiment, the second channel region 136) in plane, e.g., in plan view. Two thin film transistors, for example, the first thin film transistor and the second thin film transistor, may be formed on one semiconductor 130, and a space occupied by the thin film transistor may be minimized.

An organic light emitting diode display including the thin film transistor according to an exemplary embodiment will be described below in detail with reference to FIGS. 1 to 4, and 5.

Figure 5:
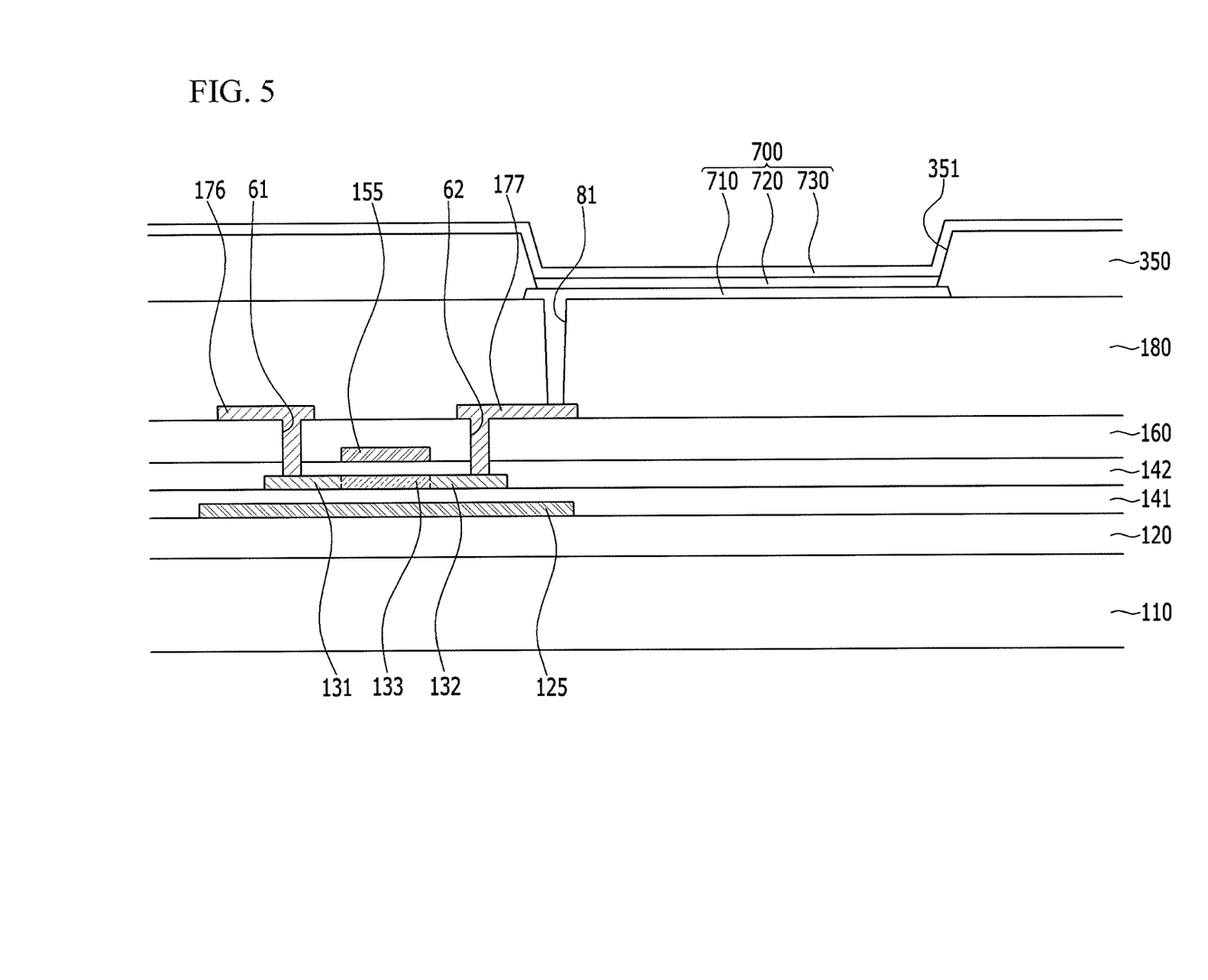
FIG. 5 illustrates a cross-sectional view of an organic light emitting diode display including the thin film transistor according to an exemplary embodiment.

FIG. 5 illustrates a cross-sectional view of an organic light emitting diode display including the thin film transistor according to an exemplary embodiment.

As illustrated in FIGS. 1 to 5, the buffer layer 120 may be formed on the substrate 110 of the organic light emitting diode display including the thin film transistor according to an exemplary embodiment, the first gate electrode 125 may be formed on the buffer layer 120, and the first insulating layer 141 may be formed on the first gate electrode 125 and the buffer layer 120. On the first insulating layer 141, the semiconductor 130 overlapping the first gate electrode 125 may be formed. The semiconductor 130 may include the first channel region 133 overlapping with the second gate electrode 155, and the first source region 131 and the first drain region 132 positioned at both sides of the first channel region 133, respectively. The semiconductor 130 may include the second channel region 136 overlapping with the first gate electrode 125, and the second source region 134 and the second drain region 135 positioned at both sides of the second channel region 136, respectively. The first channel region 133 and the second channel region 136 may correspond to the same region.

On the semiconductor 130 and the first insulating layer 141, the second insulating layer 142 may be formed, and on the second insulating layer 142, the second gate electrode 155 crossing the first gate electrode 125 in plane, e.g., in plan view, e.g., the second gate electrode 155 overlapping the first gate electrode 125 in a cross-sectional view, may be formed.

On the second gate electrode 155 and the second insulating layer 142, the third insulating layer 160 may be formed, and on the third insulating layer 160, the first source electrode 176, the first drain electrode 177, the second source electrode 178, and the second drain electrode 179 may be formed. The first source electrode 176 and the first drain electrode 177 may face each other based on the second gate electrode 155, and the second source electrode 178 and the second drain electrode 179 may face each other based on the first gate electrode 125.

The first source electrode 176 and the first drain electrode 177 may be connected with the first source region 131 and the first drain region 132 through the pair of first contact holes 61 and 62 formed in the second insulating layer 142 and the third insulating layer 160, respectively, and the second source electrode 178 and the second drain electrode 179 may be connected with the second source region 134 and the second drain region 135 though the pair of second contact holes 63 and 64 formed in the second insulating layer 142 and the third insulating layer 143.

The first thin film transistor formed by the first gate electrode 125, the first channel region 133, the first source electrode 176, and the first drain electrode 177 and the second thin film transistor formed by the second gate electrode 155, the second channel region, the second source electrode 178, and the second drain electrode 179 may be formed on one semiconductor 130.

Two thin film transistors, for example, the first thin film transistor and the second thin film transistor, may be formed on one semiconductor 130, and a space occupied by the thin film transistor may be minimized. The organic light emitting diode display including the thin film transistor may be manufactured with a high resolution.

A passivation layer 180 may be formed on the first source electrode 176, the first drain electrode 177, the second source electrode 178, the second drain electrode 179, and the third insulating layer 160, and a pixel electrode 710 may be formed on the passivation layer 180. The pixel electrode 710 may be electrically connected with the drain electrode 177 through a contact hole 81 formed in the passivation layer 180 and may become an anode of the organic light emitting diode 70. A pixel defining layer 350 may be formed on the passivation layer 180 and an edge of the pixel electrode 710. The pixel defining layer 350 may have a pixel opening 351 exposing the pixel electrode 710. The pixel defining layer 350 may be formed by including, for example, a resin such as a polyacrylate or a polyimide or a silica-based inorganic material. In the pixel opening 351 of the pixel defining layer 350, an organic emission layer 720 may be formed. The organic emission layer 720 may be formed by multiple layers including at least one of a light emission layer, a hole injection layer (HIL), a hole transporting layer (HTL), an electron transporting layer (ETL), and an electron injection layer (EIL). When the organic emission layer 720 includes the layers, the hole injection layer may be positioned on the pixel electrode 710 which may be an anode, and the hole transporting layer, the light emission layer, the electron transporting layer, and the electron injection layer may be sequentially laminated thereon.

A common electrode 730 may be formed on the pixel defining layer 350 and the organic emission layer 720. The common electrode 730 may be formed by a reflective layer made of a reflective material or a transflective layer. The common electrode 730 may become a cathode of the organic light emitting diode 70. The pixel electrode 710, the organic emission layer 720, and the common electrode 730 may form the organic light emitting diode 700.

By way of summation and review, an organic light emitting diode display may include a plurality of pixels including an organic light emitting diode configured by the cathode, the anode, and the organic emission layer, and in each pixel, a plurality of thin film transistors and capacitors for driving the organic light emitting diode may be formed. The plurality of thin film transistors may include a switching thin film transistor and a driving thin film transistor.

To help improve charge mobility of the thin film transistors and minimize leakage current, a double gate type thin film transistor may be applied. The double gate type thin film transistor may include by a lower gate electrode, a first gate insulating layer covering the lower gate electrode, a semiconductor formed on the first gate insulating layer and made of polysilicon, a second gate insulating layer covering the semiconductor, an upper gate electrode formed on the second gate insulating layer and partially overlapping with the semiconductor, an interlayer insulating layer covering the upper gate electrode and the second gate insulating layer, and a source electrode and a drain electrode connected with the semiconductor exposed through contact holes formed in the interlayer insulating layer and the second gate insulating layer. The double gate type thin film transistor may increase a current path to help improve the charge mobility and minimize the leakage current. The double gate type thin film transistor may not be used as two thin film transistors to which different gate signals may be applied.

Provided are a thin film transistor and an organic light emitting diode display including the same in which two thin film transistors may be formed on one semiconductor.

According to an exemplary embodiment, both a first thin film transistor positioned in a length direction of the semiconductor and a second thin film transistor positioned in a width direction of the semiconductor may be formed on one semiconductor, and a space occupied by the thin film transistors may be minimized.

It may be possible to manufacture an organic light emitting diode display including the thin film transistor with a high resolution.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A thin film transistor, comprising:
a substrate;
a first gate electrode on the substrate;
a first insulating layer covering the substrate and the first gate electrode;
a semiconductor on the first insulating layer and overlapping the first gate electrode;
a second insulating layer covering the first insulating layer and the semiconductor;
a second gate electrode on the second insulating layer and crossing the first gate electrode in plane;
a third insulating layer covering the second gate electrode and the second insulating layer;
a first source electrode and a first drain electrode on the third insulating layer and connected to the semiconductor; and
a second source electrode and a second drain electrode on a same layer as the first source electrode and the first drain electrode and connected to the semiconductor, wherein:
the first gate electrode controls a first current path formed through the first source electrode, the first drain electrode, and the semiconductor, and
the second gate electrode controls a second current path formed through the second source electrode, the second drain electrode, and the semiconductor.

2. The thin film transistor as claimed in claim 1, wherein:
the first source electrode and the first drain electrode are positioned in a length direction of the first gate electrode, and
the second source electrode and the second drain electrode are positioned in a length direction of the second gate electrode.

3. The thin film transistor as claimed in claim 2, wherein:
the first source electrode and the first drain electrode face each other based on the second gate electrode, and
the second source electrode and the second drain electrode face each other based on the first gate electrode.

4. The thin film transistor as claimed in claim 3, wherein the semiconductor includes:
a first channel region overlapping the second gate electrode, and a first source region and a first drain region positioned at respective sides of the first channel region, and
a second channel region overlapping the first gate electrode, and a second source region and a second drain region positioned at respective sides of the second channel region, and
the first channel region and the second channel region correspond to a same region.

5. The thin film transistor as claimed in claim 4, wherein:
the first source electrode and the first drain electrode are connected to the first source region and the first drain region through a pair of first contact holes which are formed in the second insulating layer and the third insulating layer to expose the first source region and the first drain region, respectively, and
the second source electrode and the second drain electrode are connected to the second source region and the second drain region through a pair of second contact holes which are formed in the second insulating layer and the third insulating layer to expose the second source region and the second drain region, respectively.

6. The thin film transistor as claimed in claim 4, wherein the first source electrode, the second source electrode, the first drain electrode, and the second drain electrode surround the first channel region in plane.

7. The thin film transistor as claimed in claim 1, further comprising:
   a first gate line transferring a first gate signal to the first gate electrode; and
   a second gate line transferring a second gate signal to the second gate electrode,
   wherein:
   the first gate electrode is a part of the first gate line, the second gate electrode is a part of the second gate line, and
   the first gate line and the second gate line are electrically separated from each other.

8. The thin film transistor as claimed in claim 1, wherein:
   the first source electrode and the first drain electrode are coupled to the semiconductor through a pair of first contact holes, wherein
   the first gate electrode extends to overlap at least one of the pair of first contact holes.

9. An organic light emitting diode display, comprising:
   a substrate;
   a thin film transistor on the substrate; and
   an organic light emitting diode connected to the thin film transistor,
   the thin film transistor including:
   a first gate electrode on the substrate,
   a first insulating layer covering the substrate and the first gate electrode,
   a semiconductor on the first insulating layer and overlapping the first gate electrode,
   a second insulating layer covering the first insulating layer and the semiconductor,
   a second gate electrode on the second insulating layer and crossing the first gate electrode in plane,
   a third insulating layer covering the second gate electrode and the second insulating layer,
   a first source electrode and a first drain electrode on the third insulating layer and connected to the semiconductor, and
   a second source electrode and a second drain electrode on a same layer as the first source electrode and the first drain electrode and connected to the semiconductor, wherein:
   the first gate electrode controls a first current path formed through the first source electrode, the first drain electrode, and the semiconductor, and
   the second gate electrode controls a second current path formed through the second source electrode, the second drain electrode, and the semiconductor.

10. The organic light emitting diode display as claimed in claim 9, wherein:
   the first source electrode and the first drain electrode are positioned in a length direction of the first gate electrode, and
   the second source electrode and the second drain electrode are positioned in a length direction of the second gate electrode.

11. The organic light emitting diode display as claimed in claim 10, wherein:
   the first source electrode and the first drain electrode face each other based on the second gate electrode, and
   the second source electrode and the second drain electrode face each other based on the first gate electrode.

12. The organic light emitting diode display as claimed in claim 11, wherein the semiconductor includes:
   a first channel region overlapping the second gate electrode, and a first source region and a first drain region positioned at respective sides of the first channel region, and
   a second channel region overlapping the first gate electrode, and a second source region and a second drain region positioned at respective sides of the second channel region, and
   the first channel region and the second channel region correspond to a same region.

13. The organic light emitting diode display as claimed in claim 12, wherein the first source electrode, the second source electrode, the first drain electrode, and the second drain electrode surround the first channel region in plane.

* * * * *